United States Patent [19]

Terrill et al.

[11] Patent Number: 5,289,027

[45] Date of Patent: Feb. 22, 1994

[54] ULTRATHIN SUBMICRON MOSFET WITH INTRINSIC CHANNEL

[75] Inventors: Kyle W. Terrill, Santa Monica; Prahalad K. Vasudev, Thousand Oaks, both of Calif.

[73] Assignee: Hughes Aircraft Company, Los Angeles, Calif.

[21] Appl. No.: 951,598

[22] Filed: Sep. 28, 1992

Related U.S. Application Data

[63] Continuation of Ser. No. 577,838, Aug. 31, 1990, abandoned, which is a continuation of Ser. No. 282,150, Dec. 9, 1988, abandoned.

[51] Int. Cl.$^5$ .................... H01L 27/01; H01L 29/10; H01L 29/78; H01L 27/12
[52] U.S. Cl. .................... 257/327; 257/347; 257/350; 257/365; 257/366
[58] Field of Search ............. 357/23.4, 23.7, 4, 58, 357/23.14, 23.3; 257/327, 347, 350, 365, 366

[56] References Cited

U.S. PATENT DOCUMENTS

| | | | |
|---|---|---|---|
| 3,821,781 | 6/1974 | Chang et al. | 357/44 |
| 4,236,167 | 11/1980 | Woods | 357/23.7 |
| 4,420,870 | 12/1983 | Kimura | 357/23.7 |
| 4,499,482 | 2/1985 | Levine | 357/23.1 |
| 4,555,623 | 11/1985 | Bridgewater et al. | 250/214 |
| 4,748,485 | 5/1988 | Vasudev | 357/23.7 |
| 4,823,180 | 4/1989 | Wieder et al. | 357/23.7 |

FOREIGN PATENT DOCUMENTS

| | | | |
|---|---|---|---|
| 0211367 | 2/1987 | European Pat. Off. | 357/23.7 |
| 63-151083 | 6/1988 | Japan | 357/23.7 |

OTHER PUBLICATIONS

An Introduction to Semiconductor Microtechnology, by Morgan et al. 1983, pp. 14-20 and 30.
McGraw-Hill Encyclopedia of Science and Technology 6th ed., 1987, pp. 575-577.
H. Hayashi et al., "High Performance Superthin Film Transistor (SFT) with Twin Gates", Extended Abstracts of the 14th Conference on Solid State Devices and Materials, Aug. 25-27, 1987, pp. 59-62.
F. Balestra et al., "Double-Gate Silicon-on-Insulator Transistor with Volume Inversion: A New Device with Greatly Enhanced Performance," IEEE Electron Device Letters, vol. EDL-8, No. 9, Sep. 1987, New York, pp. 410-412.
S.S. Tsao et al., "Gate Coupling and Floating-Body Effects in Thin-Film SOI MOSFETS," Electronics Letters, vol. 24, No. 4, Feb. 18, 1988, pp. 238-239.
M. Toshini et al., "High Performance SOI MOSFET Using Ultra-Thin SOI Film," Intl. Electron Devices Meeting, Washington, D.C., IEEE (U.S.), Dec. 6-9, 1987 pp. 640-643.
Patent Abstracts of Japan, vol. 9, No. 181 (E-331) (1904), Jul. 26, 1985 and JP, A, 6052058 (Komatsu Seisakusho K.K.) Mar. 23, 1985.

*Primary Examiner*—Mark V. Prenty
*Attorney, Agent, or Firm*—V. D. Duraiswamy; E. E. Leitereg; W. K. Denson-Low

[57] ABSTRACT

A submicron MOSFET is fabricated on an ultrathin layer with a generally intrinsic channel having a dopant concentration less than about $10^{16} cm^{-3}$. The channel thickness is preferably no greater than about 0.2 microns; the ratio of channel thickness to length is less than about 1:4, and preferably no greater than about 1:2. Punchthrough and other short-channel effects are inhibited by the application of an appropriate back-gate voltage, which may also be varied to adjust the voltage threshold.

1 Claim, 6 Drawing Sheets

ULTRATHIN SUBMICRON MOSFET WITH INTRINSIC CHANNEL

This is a continuation of application Ser. No. 07/577,838, filed Aug. 31, 1990, now abandoned, which is a continuation of application Ser. No. 282,150, filed Dec. 9, 1988, now abandoned.

BACKGROUND OF THE INVENTION

1. Field of the Invention

This invention relates to semiconductor transistor devices, and more particularly to submicron metal-oxide-semiconductor field effect transistors (MOSFETs), fabricated in ultra-thin silicon film.

2. Description of the Related Art

New techniques such as SIMOX (separation by implanted oxygen) layers have recently been developed for fabricating high quality thin silicon films on buried oxides. For example, see the article by the present inventors together with S. Seymour, "A High Performance Submicrometer CMOS/SOI Technology Using Ultrathin Silicon Films on SIMOX", 1988 VLSI Technology Symposium Tech. Digest. This technique has been used to improve radiation hardness and to promote volume inversion. An example of such a device is given in a published letter by Tsao et al., "Gate Coupling and Floating-Body Effects in Thin-Film SOI MOSFETs", *Electronics Letters*, Feb. 18, 1988, Vol. 24, No. 4, pages 238-39 ("SOI" refers to silicon-on-insulator). This letter discloses the fabrication of long channel (channel length of about 3 microns) n-channel MOSFETs with a thin silicon film 0.13 micron thick and channel doping concentration of $2 \times 10^{16}/cm^{-3}$.

Typical ultrathin MOSFET designs with channel lengths below 1 micron require high dopant densities in the channel region to prevent device punchthrough. Punchthrough occurs when electric field lines from the drain extend toward the source and reduce the potential barrier height. This effect is normally prevented by sufficiently doping the channel so that the source is shielded from the drain by a space-charge region. For submicron devices the required dopant density substantially exceeds $10^{16} cm^{-3}$, and can be as large as $10^{17} cm^{-3}$. This level of channel doping has also been found to be useful in preventing short-channel effects, principally a threshold roll-off effect in which the device's voltage threshold falls off as the channel length is reduced. Another short channel effect overcome by doping the channel in this manner is a degradation in the sub-threshold current-voltage characteristic as the channel length is reduced, which is reflected by a reduction in turn-off performance. However, in addition to requiring the fabrication step of a channel implant, these devices are somewhat limited in terms of electron mobility and transconductance. Due to their subthreshold characteristics they also do not turn off as rapidly as might be desired.

SUMMARY OF THE INVENTION

In view of the above problems, the present invention seeks to provide an ultrathin MOSFET with submicrometer channel lengths that avoids punchthrough and other short-channel effects encountered in conventional bulk MOSFETs, but in addition has excellent turn-off, subthreshold and transconductance characteristics.

Another goal is to provide a new type of ultrathin MOSFET in which the threshold voltage can be selected and adjusted by an appropriate selection of a bias voltage level, independent of channel doping.

The present invention achieves these goals by means of an ultrathin MOSFET in which the channel region is generally intrinsic, rather than heavily doped. Punchthrough and short-channel effects are inhibited by using a very thin silicon film and applying a selectable back-gate bias voltage, rather than by doping the channel. With a channel dopant concentration less than about $10^{16} cm^{-3}$, these results are achieved if the ratio of the channel thickness to its length is kept less than about 1:2, and preferably no greater than about 1:4. The absolute value of channel thickness is preferably less than about 0.2 microns.

The device is formed in an SOI configuration, preferably upon a buried oxide layer, which in turn is provided on a bulk semiconductor substrate. The voltage threshold for the device can be set and adjusted by applying a suitable back-gate voltage to the substrate. The resulting MOSFET avoids punchthrough and short-channel effects, and otherwise has improved operating characteristics compared to prior MOSFETs with heavily doped channels These and other features and advantages of the invention will be apparent to those skilled in the art from the following detailed description, taken together with the accompanying drawings, in which:

DETAILED DESCRIPTION OF THE INVENTION

Figure 1:
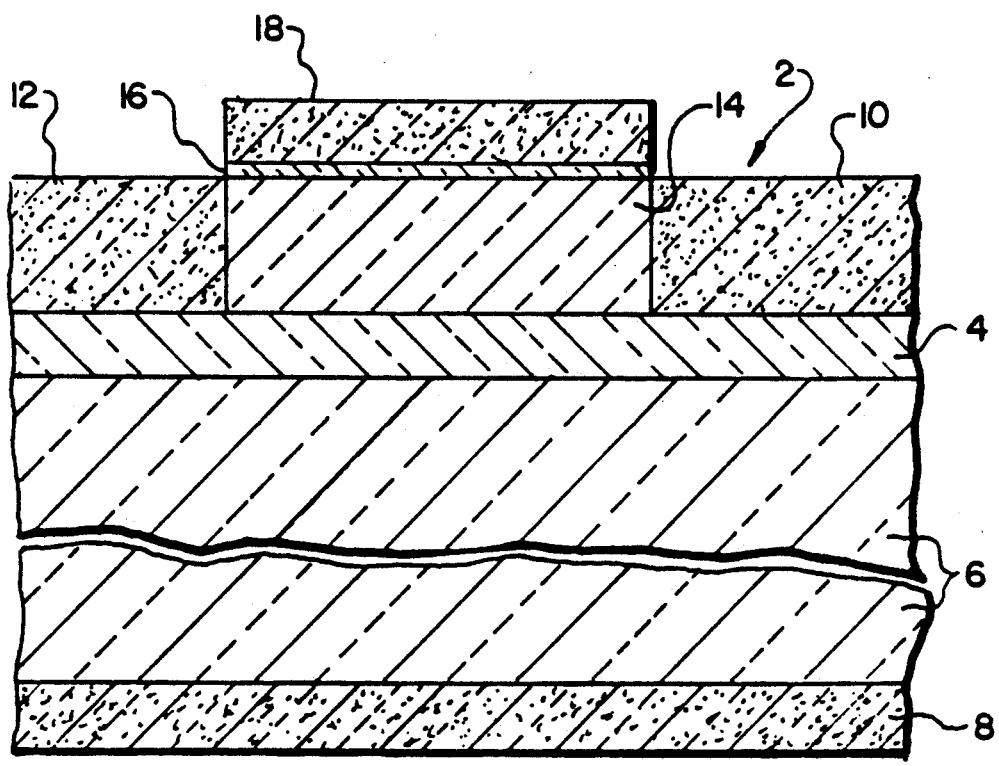
FIG. 1 is a cross-sectional diagram of a MOSFET constructed in accordance with the present invention.

A cross-sectional view of a mesa isolated n-channel MOSFET constructed in accordance with the invention is shown in FIG. 1. The invention is equally applicable to p-channel devices, in which the doping of the source and drain and the polarity of the bias voltages would be reversed. The device shown in FIG. 1 can be implemented with conventional fabrication techniques. It consists of an ultrathin (generally less than a half micron) layer of semiconductor material 2 fabricated on a buried insulator layer 4. Silicon is preferred for the semiconductor material because fabrication is relatively easy, but other semiconductor materials could also be used. The buried insulator layer 4 is preferably an oxide, but other insulating materials such as nitrides could also be used. The SIMOX (separation by implanted oxygen) technique is preferably employed for the fabrications.

Oxide layer 4 is formed on a bulk silicon or other semiconductor wafer 6, which carries a back-gate electrode 8 on its opposite side. Electrode 8 is formed from a conductive material such as metal or heavily doped semiconductor, and receives a back-gate bias voltage which sets the operating characteristics of the device.

Spaced regions of semiconductor layer 2 are heavily doped to form a drain region 10 and source region 12. The intermediate portion of the semiconductor layer which extends between the drain and source forms a channel region 14. This region is generally intrinsic, meaning that it is only lightly doped. Bulk silicon normally comes with a certain level of dopants, but these are impurities rather than deliberately introduced. The dopant impurity concentration in bulk silicon is typically on the order of $10^{14} cm^{-3}$, and sometimes more. The present invention will work with either undoped bulk silicon for the channel region, or with a generally low level of channel doping considerably less than channel dopings previously employed. The channel region may be regarded as "generally intrinsic", which for purposes of the invention is defined as ranging from a bulk semiconductor dopant impurity level on the order of $10^{14} cm^{-3}$ or less through a level no greater than about $10^{16} cm^{-3}$.

A thin oxide layer 16 is provided over the channel region 14 (in practice this oxide layer will normally extend over the entire device). The insulating oxide layer 16 is surmounted by a polysilicon gate 18 in alignment with the channel region.

It has been discovered that a device of this type can be designed to operate without punchthrough or short-channel effects. These phenomena are prevented by the application of a bias voltage to the back-gate 8, which tends to accumulate charged carriers at the interface between the semiconductor channel region 14 and the buried oxide layer 4. The applied back-gate bias produces an electric field which induces charged carriers in the channel region without having to introduce dopants into the channel. The carriers and electric field induced by the back-gate bias voltage have been found to effectively prevent punchthrough and short-channel effects.

The achievement of proper operation has been found to be dependent upon the absolute channel thickness as well as the ratio of channel thickness to channel length. While submicron channel thicknesses in general are permissible, it is preferred that the channel be not more than about 0.2 microns thick. The ratio of channel thickness to length should be less than 1:2, and preferably not more than 1:4. The buried oxide layer 4 is preferably about 0.3–0.5 microns thick and the gate insulating layer 16 about 0.012 microns thick, although both elements can vary from these dimensions.

In one n-channel implementation of the invention, MOSFETs were fabricated on ultra-shallow SOI material with a silicon film thickness of about 0.2 microns. The channel doping in these films was determined by the bulk doping concentration of about $5 \times 10^{15} cm^{-3}$. While this channel doping concentration was over an order of magnitude less than the concentration generally required to prevent punchthrough and short-channel effects in submicron MOSFETs, fully functional devices were obtained by the application of a $-15$ volt back-gate bias. N-channel MOSFETs with more conventional (much higher) channel implants were fabricated on the same wafer. When the two types of devices were compared, it was found that the devices formed in accordance with the invention with generally intrinsic channels showed an increase in electron mobility of over 100 $cm^2/vs$. The sub-threshold slope factor S (mv/decade) was also reduced by about 10 mv/decade in the unimplanted device, resulting in an improved turn-off characteristic.

Figure 2:
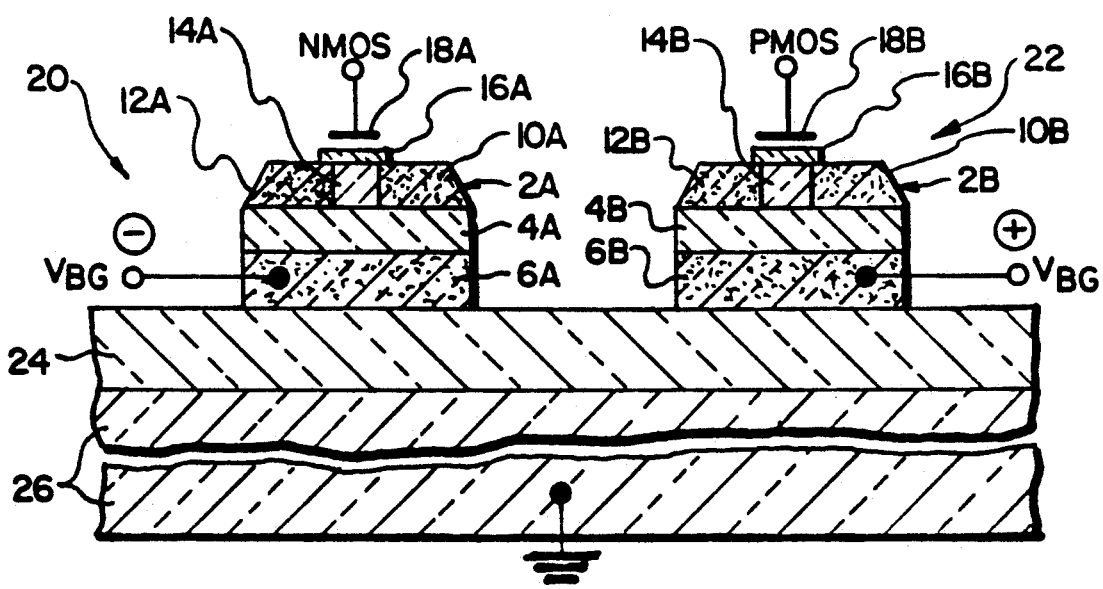
FIG. 2 is a cross-sectional diagram of a pair of such MOSFETs arranged in a CMOS configuration.

The invention is applicable to various circuit configurations. A CMOS example is illustrated in FIG. 2. An n-channel device 20 is shown on the left hand side of the structure, with a p-channel device 22 on the right hand side. Both devices are constructed in a manner similar to that shown in FIG. 1, with the elements of n-channel MOSFET 20 identified by the letter A and those of p-channel MOSFET 22 identified by the letter B. Back-gate voltages of opposite polarity are applied to their respective substrates 6A and 6B. To provide further isolation between the two devices, they are fabricated on an additional oxide layer 24, which in turn is carried by a semiconductor substrate 26.

Figure 3:
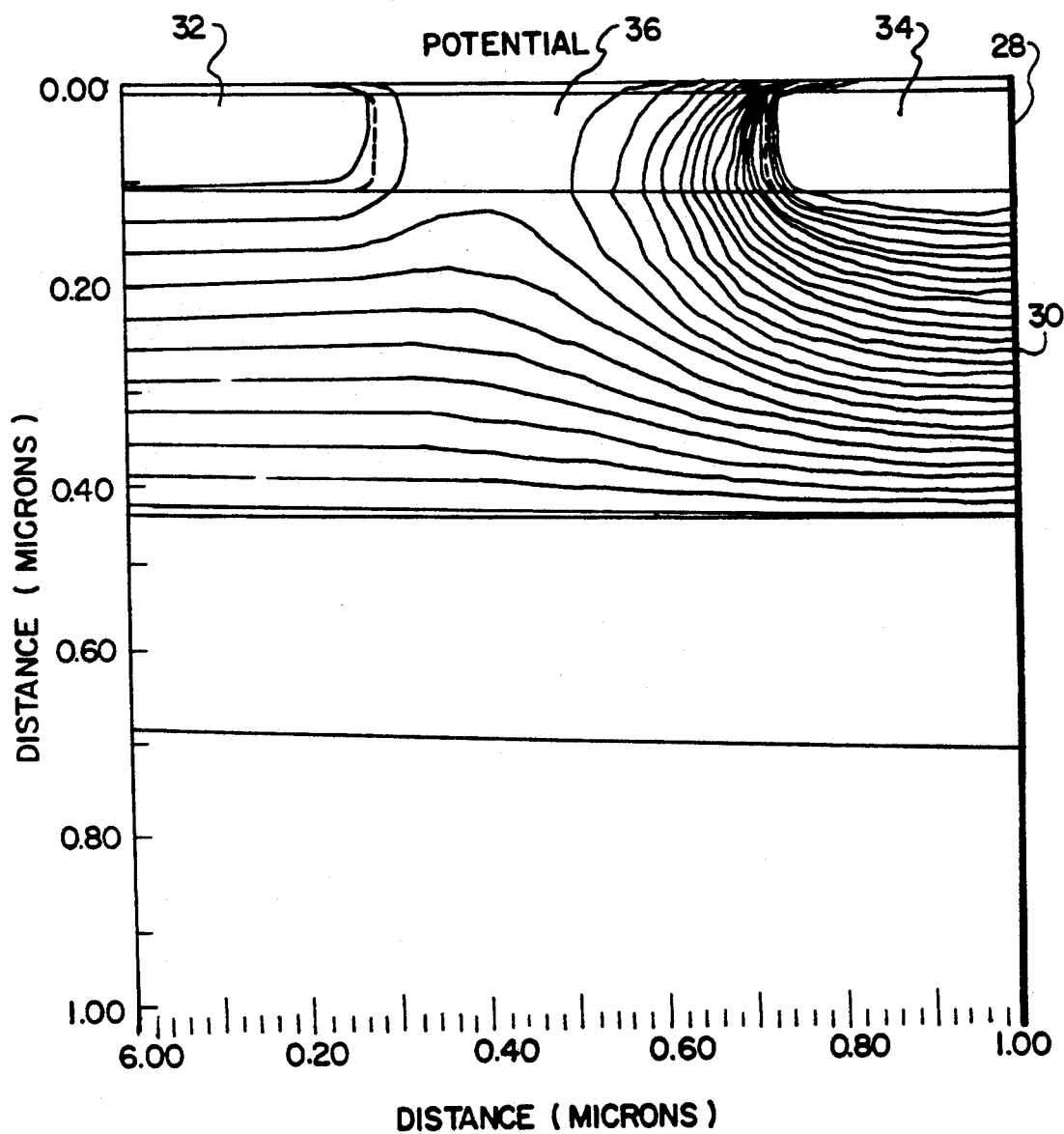
FIGS. 3 and 4 are plots of electric potential for devices with channel dopings of $10^{16} cm^{-3}$ and $10^{14} cm^{-3}$, respectively.
Figure 4:
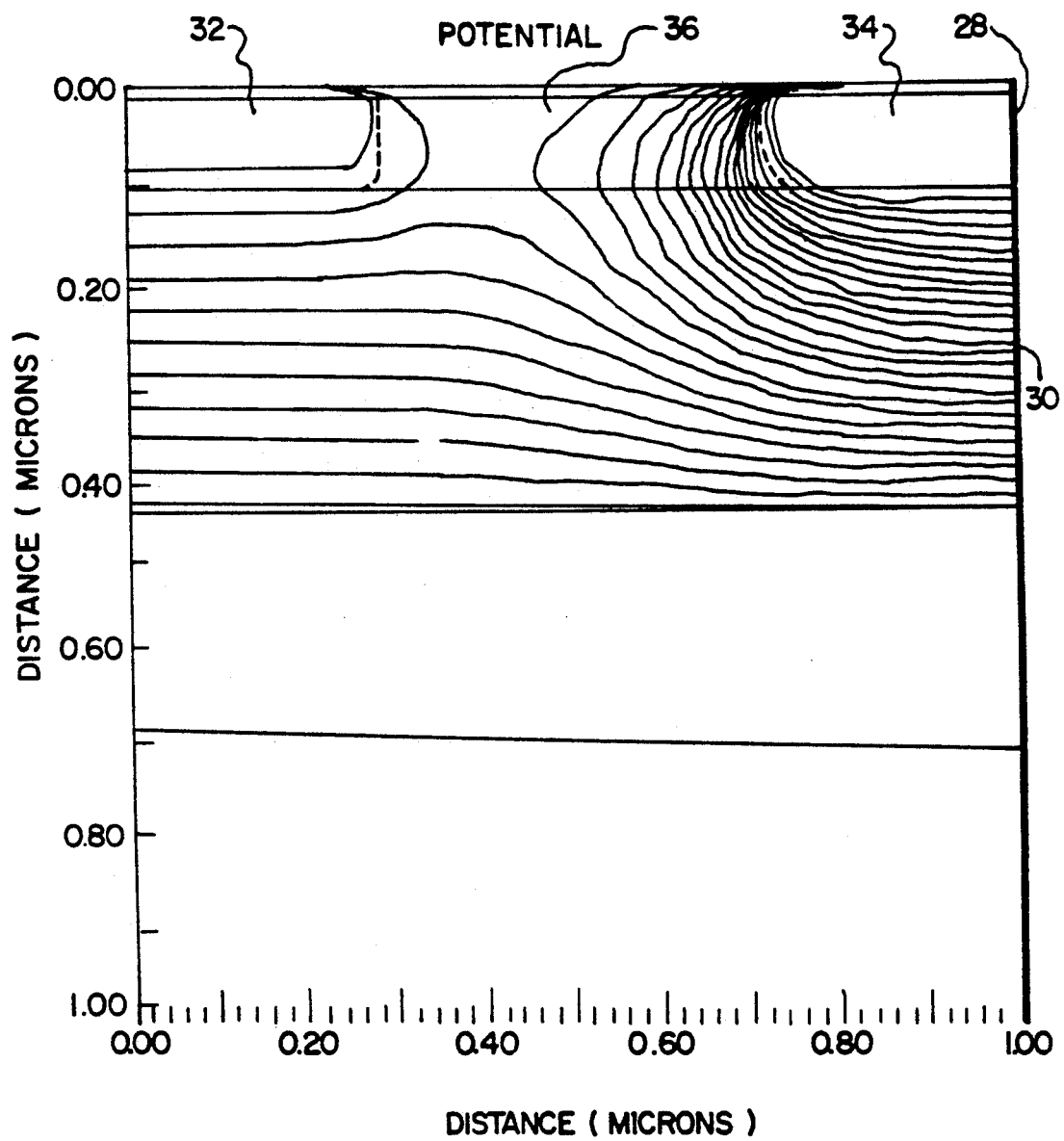

The mechanism by which punchthrough is prevented is illustrated in FIGS. 3 and 4. FIG. 3 shows an electric potential plot for a MOSFET formed with a 0.1 micron thick silicon film 28 on a 0.35 micron thick buried oxide layer 30. Source 32, drain 34 and channel 36 regions are formed in silicon film 28. In FIG. 3 the channel doping was $10^{16} cm^{-3}$, while in FIG. 4 the channel was nearly intrinsic (about $10^{14} cm^{-3}$). A back-gate bias of $-2$ volts was used for a simulation of both n-channel devices. In FIG. 3, with a channel doping less than that required by prior submicron MOSFETs, it can be seen that the equal potential lines are deflected out of the channel area. Since the electric field lines are normal to the lines of equal potential, this means that the electric field lines are progressively deflected out of the channel area and do not extend all the way from the drain to the source. Accordingly, punchthrough is prevented. FIG. 4 shows that, although the field lines emanating from the source and drain approach somewhat more closely with a channel region that is more nearly true intrinsic, punchthrough still does not occur.

Figure 5:
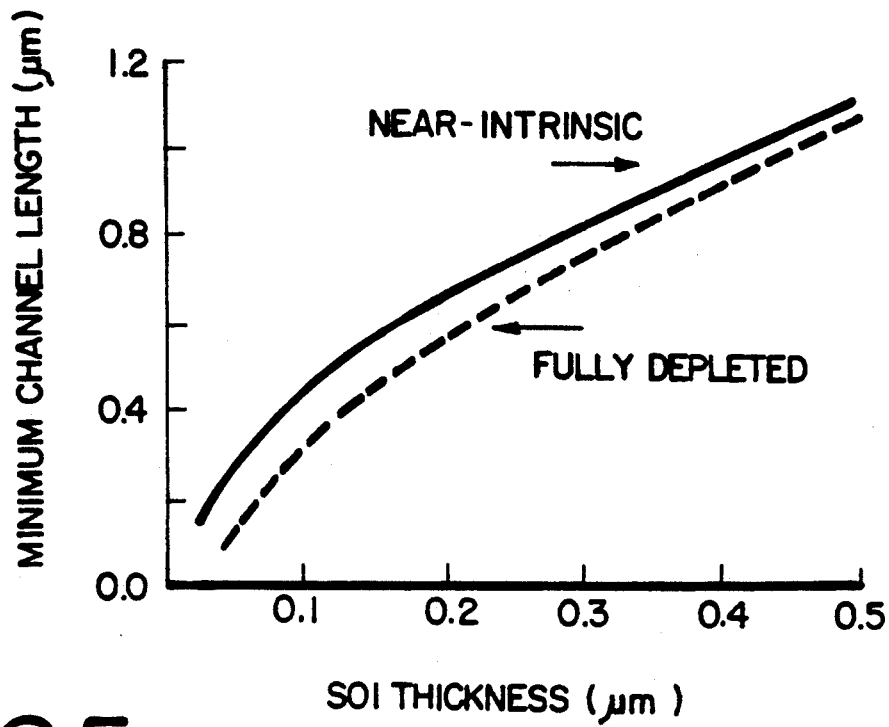
FIG. 5 is a graph plotting the calculated minimum channel length as a function of semiconductor film thickness.

FIG. 5 shows the results of an analytical model that was developed to predict the scalability of fully depleted and near-intrinsic MOSFETs fabricated on ultra-thin SIMOX films. The analysis proceeded by plotting the minimum channel length as a function of SOI film thickness for both fully depleted and near-intrinsic (about $10^{14} cm^{-3}$) MOSFETs. The results are for a uniform channel dopant distribution as a function of depth. The level of channel doping in the near-intrinsic device was too low to provide any significant punchthrough protection. Punchthrough was inhibited by the electric field lines from the drain fringing toward both the top and bottom gates, rather than reaching the source; this effect was a result of the applied back-gate bias, which was $-5$ volts in the analysis.

For an increasing SOI thickness (the thickness of the silicon film which includes the channel), FIG. 5 indicates that the minimum channel length for proper operation increased somewhat less than linearly. For an SOI thickness of 0.5 microns, the minimum channel length was about 1.1 microns, for a ratio just under 1:2. The ratio was about 1:3 for a 0.2 micron channel thickness, and about 1:4 for a 0.1 micron channel thickness.

Figure 6:
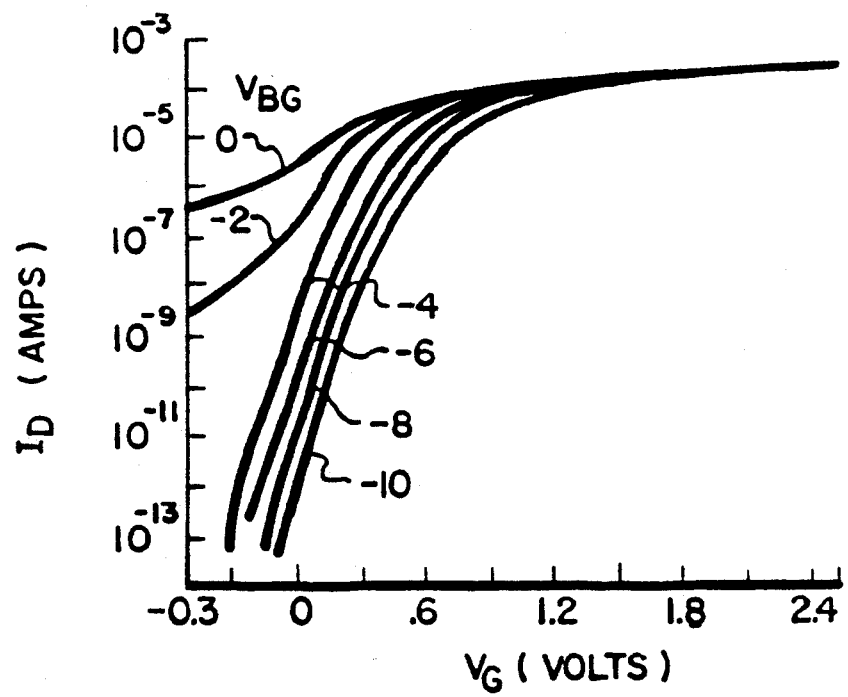
FIG. 6 is a graph illustrating the sub-threshold I-V characteristics of a device formed according to the invention for various back-gate bias voltages.

FIG. 6 shows the subthreshold I–V characteristics as a function of gate voltage for an n-channel device fabricated with a channel 0.75 microns long, 20 microns wide and 0.18 microns thick, and operated with a 1 volt drain-source voltage at a temperature of 85° K. The I–V characteristics of the device are shown with back-gate biases varying from zero to 10 volts. It can be seen from this graph that the voltage threshold of the device can be controlled in a predictable fashion by an appropriate setting of the back-gate bias. Desirable turn-off characteristics and a proper voltage threshold of about 0.4 volts were realized with back-gate biases in the approximate range of −4 to −10 volts.

Figure 7:
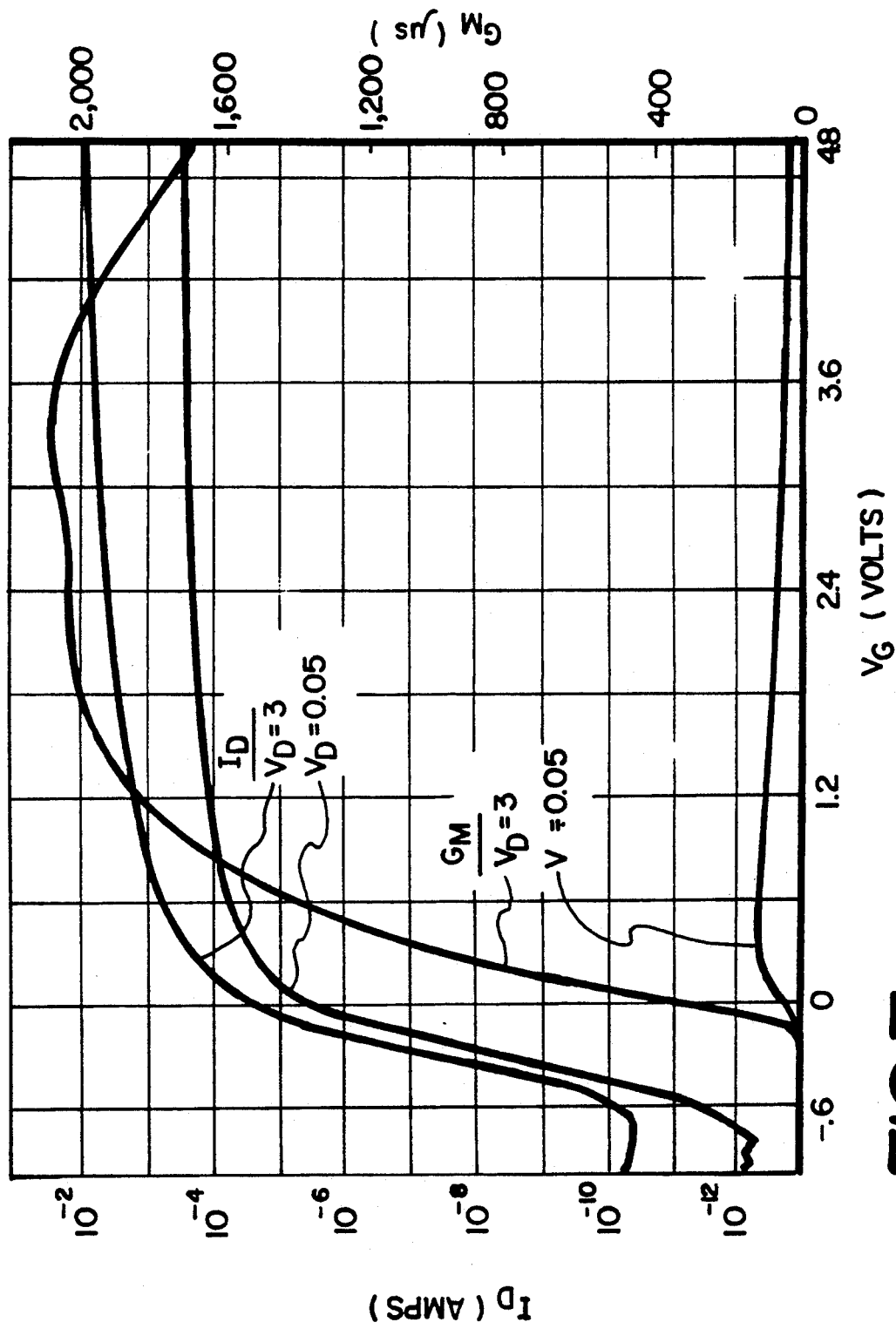
FIG. 7 is a graph plotting drain current (gain) and transconductance as a function of gate voltage for two difference values of drain voltage; and FIGS. B and 9 are graphs illustrating the temperature dependence of the transconductance and output characteristics, respectively, for a device constructed in accordance with the invention.

FIG. 7 is a plot of drain current and transconductance as a function of gate voltage for an n-channel MOSFET having a channel thickness of 0.2 microns and bulk doping concentration of about $5 \times 10^{15} cm^{-3}$; no threshold voltage adjustment or punchthrough implants were performed. Fully functional devices were obtained with a −15 volt back-gate bias. The drain current curves, plotted against the logarithmic current scale on the left hand vertical axis, show that the device can stand off a drain voltage of 3 volts without significant current flow below threshold. The transconductance curves, plotted against the linear scale on the right hand vertical axis, show that the device operates properly to provide gain. However, even with a −15 volt back-gate bias, the threshold voltage is shifted to a negative level due to the near-intrinsic channel doping, as opposed to the positive threshold voltage normally associated with a doped n-channel MOSFET. With a conventional ultrathin n-channel device, counter-doping would normally be required to obtain this type of negative voltage threshold.

Figure 8:
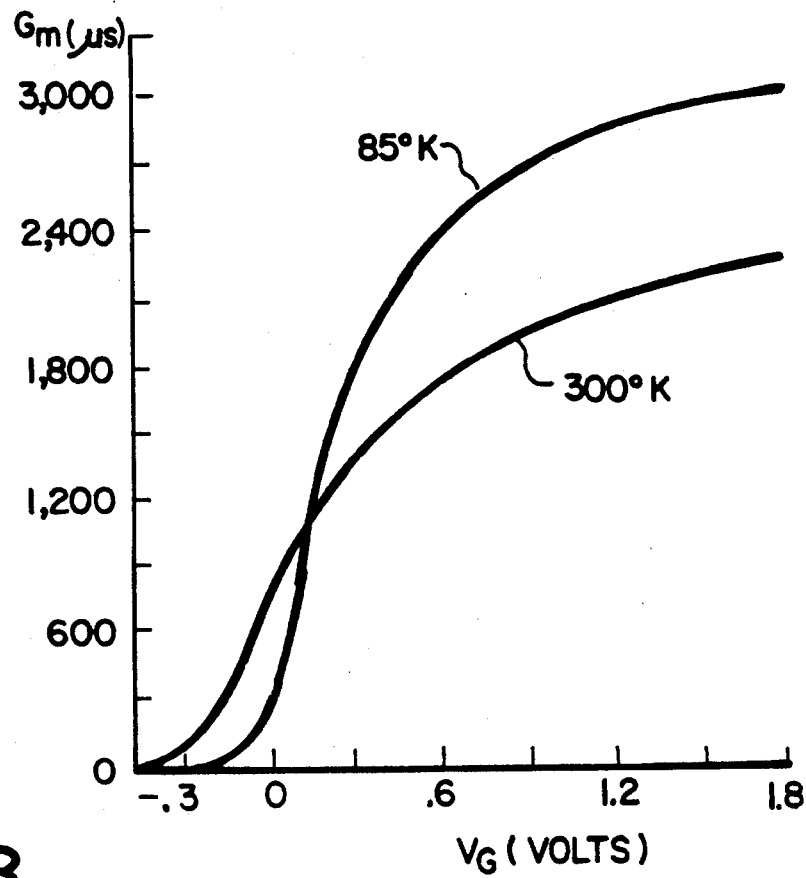
Figure 9:
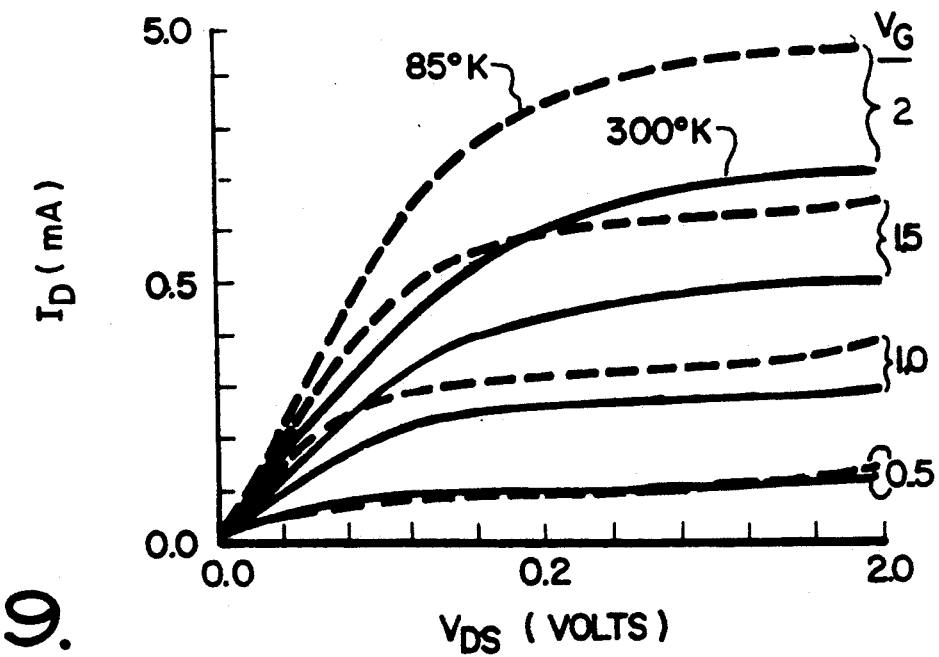

FIGS. 8 and 9 illustrate the temperature dependence of a device fabricated in accordance with the invention. The particular device was an n-channel silicon MOSFET with a channel thickness of 0.18 microns, effective channel length of 0.75 microns, channel width of 20 microns, and a near-intrinsic ($10^{15} cm^{-3}$) channel dopant concentration. Although this device demonstrated enhanced mobility, its low threshold voltage made it less than suitable for room temperature operation. However, the threshold was increased by operation at cryogenic temperatures and through the application of back-gate bias. The measured low field channel mobility as a function of gate bias was increased by a factor of about 2.5 at a cryogenic temperature of 85° K compared to operation at room temperature. The transconductance and output characteristics of the device at both room temperature and 85° K are shown in FIGS. 8 and 9, respectively. The drain saturation current was found to improve by about 30% as the temperature was reduced.

The invention thus makes available a novel ultrathin MOSFET that exhibits improved operating characteristics, yet avoids the need for a channel implant While several illustrative embodiments of the invention have been shown and described, numerous variations and alternate embodiments will occur to those skilled in the art, without departing from the spirit and scope of the invention. For example, the techniques of the invention may be applied to JFETs other than MOSFETs. Accordingly, it is intended that, within the scope of the appended claims, the present invention may be practiced otherwise than as specifically described.

We claim:

1. A metal-oxide-semiconductor field transistor (MOSFET) structure, comprising:
   a first insulating layer, the thickness of said first insulating layer being within the approximate range of 0.3–0.5 microns,
   a submicron-thick semiconductor layer on said first insulating layer, said semiconductor layer having mutually spaced doped source and drain regions and a generally intrinsic bulk channel region of bulk semiconductor material extending between said source and drain regions, said channel region having a dopant concentration less than about $10^{16} cm^{-3}$,
   a second insulating layer on said channel region,
   a conductive gate on said insulating layer, and
   means for applying a back-gate bias voltage to induce both charge carriers in the channel region for MOSFET operation, and an electric field in the channel region for restricting punchthrough and other short-channel effects,
   said means for applying a back-gate bias voltage comprising a semiconductor substrate for said first insulating layer, and a conductive electrode on said substrate for receiving a voltage signal.

* * * * *